US012473630B2

(12) United States Patent
Kundu et al.

(10) Patent No.: US 12,473,630 B2
(45) Date of Patent: Nov. 18, 2025

(54) INCLUSION OF SPECIAL ROLLER TO AVOID CREASING, WRINKLING AND DISTORTION OF FLEXIBLE SUBSTRATE IN ROLL TO ROLL PROCESS

(71) Applicant: Elevated Materials US LLC, Santa Clara, CA (US)

(72) Inventors: Sambhu Kundu, Fremont, CA (US); PrasannaKalleshwara Buddappa Ramachandrappa, Santa Clara, CA (US); Subramanya P. Herle, Mountain View, CA (US); Visweswaren Sivaramakrishnan, Cupertino, CA (US)

(73) Assignee: Elevated Materials US LLC, Santa Clara, CA (US)

( * ) Notice: Subject to any disclaimer, the term of this patent is extended or adjusted under 35 U.S.C. 154(b) by 281 days.

(21) Appl. No.: 17/731,565

(22) Filed: Apr. 28, 2022

(65) Prior Publication Data

US 2022/0372614 A1 Nov. 24, 2022

Related U.S. Application Data

(60) Provisional application No. 63/189,786, filed on May 18, 2021.

(51) Int. Cl.
*C23C 14/56* (2006.01)

(52) U.S. Cl.
CPC .......... *C23C 14/568* (2013.01); *C23C 14/562* (2013.01)

(58) Field of Classification Search
CPC ..... C23C 14/568; C23C 14/562; C23C 14/50; C23C 16/458; C23C 16/545
See application file for complete search history.

(56) References Cited

U.S. PATENT DOCUMENTS 6,056,180 A * 5/2000 Crowley ................ B65H 20/06 226/188
6,585,253 B1 * 7/2003 Miki .................... B65H 3/5261 271/42

(Continued)

FOREIGN PATENT DOCUMENTS

JP 2011032555 A 2/2011
JP 2011038162 A 2/2011

(Continued)

OTHER PUBLICATIONS

International Search Report and Written Opinion dated Aug. 8, 2022 for Application No. PCT/US2022/026655.

(Continued)

*Primary Examiner* — Aiden Lee
(74) *Attorney, Agent, or Firm* — Lee & Hayes, P.C.

(57) ABSTRACT

Embodiments of the present disclosure generally relate to flexible substrate fabrication. In particular, embodiments described herein relate to an apparatus and methods for flexible substrate fabrication using nip rollers to improve tension uniformity. In one embodiment, a roller assembly includes a primary roller for transporting a flexible substrate, wherein the primary roller has a first end and a second end, wherein the flexible substrate has a coating disposed hereon, and wherein one or more edge regions are not covered by the coating. The roller assembly further includes a first nip roller disposed at the first end of the primary roller that contacts a first edge region of the one or more edge regions, and a second nip roller disposed at the second end of the primary roller that contacts a second edge region of the one or more edge regions.

15 Claims, 7 Drawing Sheets

(56) References Cited

U.S. PATENT DOCUMENTS

| | | | | |
|---|---|---|---|---|
| 6,726,812 | B1 * | 4/2004 | Toyama | C23C 14/345 204/298.04 |
| 8,133,533 | B2 * | 3/2012 | Nakagame | B05D 1/28 427/255.6 |
| 2009/0196998 | A1 * | 8/2009 | Nakagame | C23C 16/545 427/294 |
| 2012/0031565 | A1 * | 2/2012 | Yokoyama | H01L 21/6776 226/176 |
| 2012/0107074 | A1 * | 5/2012 | Kunze | C23C 16/4412 414/225.01 |
| 2016/0114997 | A1 * | 4/2016 | Kawakami | B65H 23/188 226/181 |
| 2016/0190383 | A1 | 6/2016 | Shufflebotham et al. | |

FOREIGN PATENT DOCUMENTS

| | | | |
|---|---|---|---|
| KR | 101307096 | B1 | 9/2013 |
| KR | 20130097222 | A | 9/2013 |
| WO | WO2013084959 | A1 | 6/2013 |

OTHER PUBLICATIONS

Taiwan Office Action dated Oct. 13, 2023 for Application No. 111116633.

Search Report for European Application No. 22805155.3, Dated Apr. 14, 2025, 10 pages.

* cited by examiner

INCLUSION OF SPECIAL ROLLER TO AVOID CREASING, WRINKLING AND DISTORTION OF FLEXIBLE SUBSTRATE IN ROLL TO ROLL PROCESS

CROSS-REFERENCES TO RELATED APPLICATIONS

This Application claims priority to U.S. Provisional Patent Application No. 63/189,786, filed May 18, 2021, which is incorporated herein by reference in its entirety.

BACKGROUND

Field

Embodiments of the present disclosure generally relate to flexible substrate fabrication. In particular, embodiments described herein relate to an apparatus and methods for flexible substrate fabrication using nip rollers to improve tension uniformity.

Description of the Related Art

Flexible substrates may be used for packaging, semiconductor, and photovoltaic applications. Processing of flexible substrates may include coating a flexible substrate with a desired material, such as a metal, semiconductors, and/or dielectric materials. Systems for performing processing of flexible substrates generally include a processing drum, e.g., a cylindrical roller, coupled to a processing system for transporting the substrate, and on which at least a portion of the substrate is processed. Roll-to-roll coating systems thereby provide a relatively high throughput system.

Wrinkling and/or tearing at the edges of the flexible substrate may create issues during double or single side coating, which may further result in irregularities in the final product after coating. Accordingly, what is needed in the art is an apparatus for substrate fabrication, which improves tension uniformity.

SUMMARY

Embodiments of the present disclosure generally relate to flexible substrate fabrication. In particular, embodiments described herein relate to an apparatus and methods for flexible substrate fabrication using nip rollers to improve tension uniformity. In one embodiment, a roller assembly includes a primary roller for transporting a flexible substrate, wherein the primary roller has a first end and a second end, wherein the flexible substrate has a coating disposed hereon, and wherein one or more edge regions are not covered by the coating. The roller assembly further includes a first nip roller disposed at the first end of the primary roller that contacts a first edge region of the one or more edge regions, and a second nip roller disposed at the second end of the primary roller that contacts a second edge region of the one or more edge regions.

In another embodiment, a process chamber includes a chamber body defining an internal volume therein, and one or more roller assemblies positioned in the internal volume and configured to transport a flexible substrate. Each of the one or more roller assemblies includes a primary roller disposed in the internal volume of the process chamber, a first nip roller having a first plurality of holes formed therethrough, and a second nip roller having a second plurality of holes formed therethrough, wherein each of the first nip roller and the second nip roller contacts a respective edge portion of the flexible substrate.

In yet another embodiment, a process chamber for manufacturing a flexible substrate includes a chamber body defining an internal volume therein, a coating drum, and one or more roller assemblies configured to transport a flexible substrate. Each of the one or more roller assemblies includes a primary roller having a first end and a second end, wherein the primary roller is disposed in the internal volume of the process chamber, a first nip roller is disposed at the first end of the primary roller, wherein the first nip roller has a first plurality of holes formed therethrough, and a second nip roller is disposed at the second end of the primary roller, wherein the second nip roller has a second plurality of holes formed therethrough.

In some embodiments, a non-transitory computer readable medium has stored thereon instructions, which, when executed by a processor, cause the process to perform operations of the above apparatus and/or method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
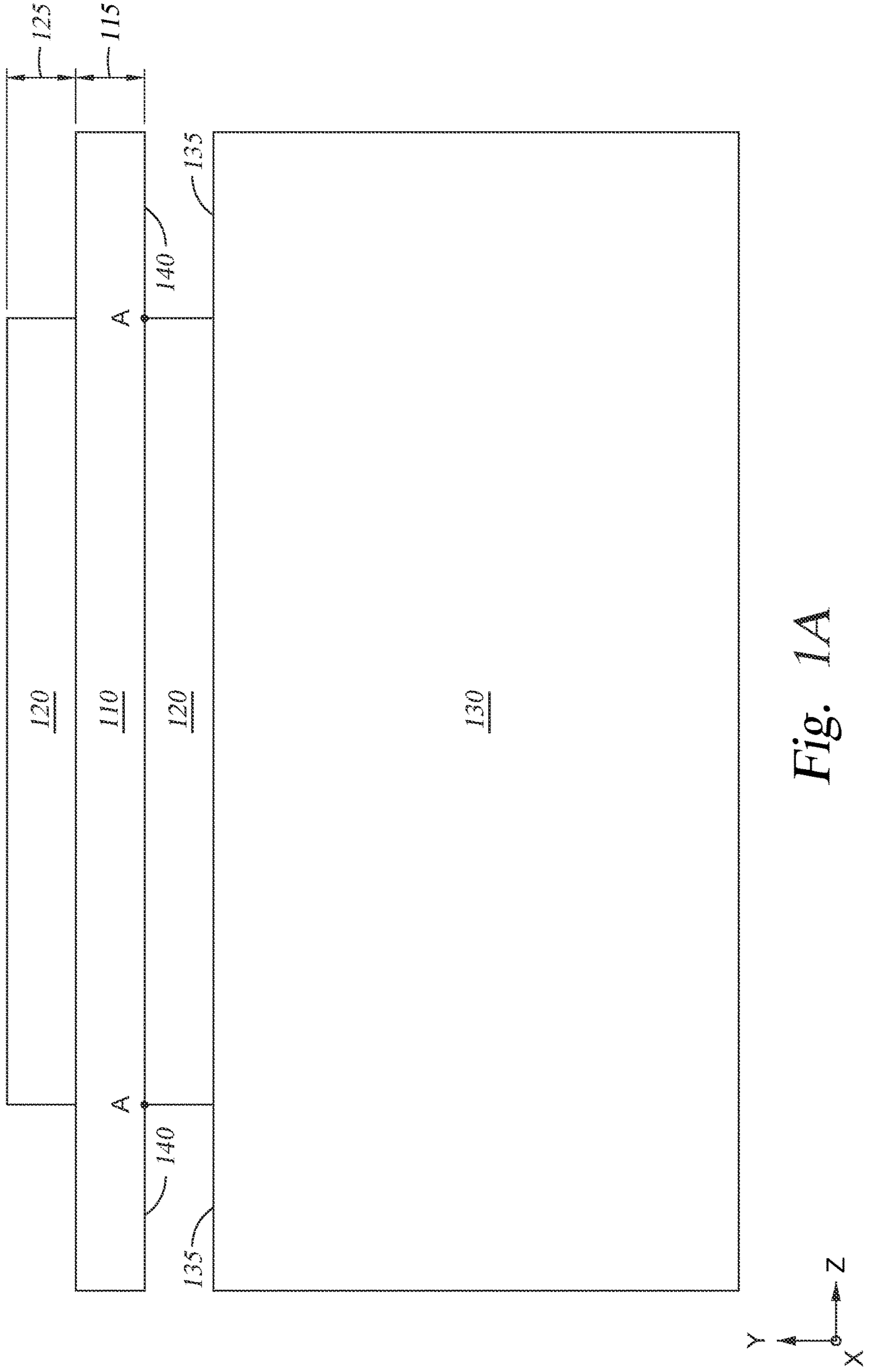
FIGS. 1A and 1B are schematic, cross-sectional views of a roller having a flexible substrate disposed thereon according to one or more embodiments.

Embodiments of the present disclosure generally relate to flexible substrate fabrication. In particular, embodiments described herein relate to an apparatus and methods for flexible substrate fabrication using nip rollers to improve tension uniformity. Certain details are set forth in the following description and in FIGS. 1A to 5 to provide a thorough understanding of various embodiments of the disclosure. Other details describing well-known structures and systems often associated with web coating, web transfer, and adjusting web tension of a flexible substrate or web in a roll-to-roll deposition system are not set forth in the following disclosure to avoid unnecessarily obscuring the description of the various embodiments.

Many of the details, dimensions, angles and other features shown in the Figures are merely illustrative of particular embodiments. Accordingly, other embodiments can have other details, components, dimensions, angles and features without departing from the spirit or scope of the present disclosure. In addition, further embodiments of the disclosure can be practiced without several of the details described below.

Embodiments described herein will be described below in reference to a roll-to-roll coating system, such as TopMet™, SmartWeb™, TopBeam™, all of which are available from Applied Materials, Inc. of Santa Clara, California. Other tools capable of performing roll-to-roll processing can also be adapted to benefit from the embodiments described herein. The apparatus description described herein is illustrative and should not be construed or interpreted as limiting the scope of the embodiments described herein. In addition, the embodiments described herein are applicable to a flexible substrate having a coating on a single side or a flexible substrate having a coating on opposing sides or a "dual-sided" coating.

It is noted that while the particular substrate on which some embodiments described herein can be practiced is not limited, it is particularly beneficial to practice the embodiments on flexible substrates, including for example, web-based substrates, panels and discrete sheets.

It is also noted here that a flexible substrate or web as used within the implementations described herein can typically be characterized in that it is bendable. The term "web" can be synonymously used to the term "strip," the term "flexible substrate," or the like. For example, the web as described in implementations herein can be a foil. Synonyms of the term "web" are strip, foil, flexible substrate or the like. Typically, a web includes a continuous sheet of thin and flexible material. Typical web materials are metals, plastics, paper, or the like. A web as understood herein is typically a three dimensional solid body. The thickness of the web as understood herein can be less than 1 mm, more typically less than 500 mm or even less than 10 mm. A web as understood herein can have a width of at least 0.5 m, more typically at least 1 m or even at least 4 m. A web as understood herein can have a length of at least 1 km, 25 km or even 60 km.

It is further noted that in the present disclosure, a "roll" or a "roller" can be understood as a device, which provides a surface, with which a substrate (or a part of a substrate) can be in contact during the presence of the substrate in the processing system. At least a part of the "roll" or "roller" as referred to herein can include a circular-like shape for contacting the substrate to be processed or already processed. In some implementations, the "roll" or "roller" can have a cylindrical or substantially cylindrical shape. The substantially cylindrical shape can be formed about a straight longitudinal axis or can be formed about a bent longitudinal axis. According to some implementations, the "roll" or "roller" as described herein can be adapted for being in contact with a flexible substrate. For example, a "roll" or "roller" as referred to herein can be a guiding roller adapted to guide a substrate while the substrate is processed (such as during a deposition process) or while the substrate is present in a processing system; a spreader roller adapted for providing a defined tension for the substrate to be coated; a deflecting roller for deflecting the substrate according to a defined travelling path; a processing roller for supporting the substrate during processing, such as a process drum, for example, a coating roller or a coating drum; an adjusting roller, a supply roll, a take-up roll or the like. The "roll" or "roller" as described herein can comprise a metal.

Web coating for anode pre-lithiation and solid metal anode formation typically involves thick (three to twenty micron) metallic lithium deposition on single or double-side-coated and calendered alloy-type graphite anodes and current collectors, for example, six micron or thicker copper foil, nickel foil, or metallized plastic web. Variations in tension along the web during processing can lead to wrinkles and other deformities at the edges of the processed web, which can ruin the processed web. One way of adjusting web tension in the chamber is to shut down the web system, open the web system, and physically adjust the tension. However, this can lead to significant downtime to the web system, which increases the cost of ownership. In addition, these deformities in the web may not be detected until after the entire web is processed. This can lead to scrapping the processed web, which increases material costs. Thus, it would be advantageous to be able to dynamically adjust tension at the edges of the web during processing to reduce wrinkling and/or tearing at the edges of the flexible substrate without opening the system.

Figure 1B:
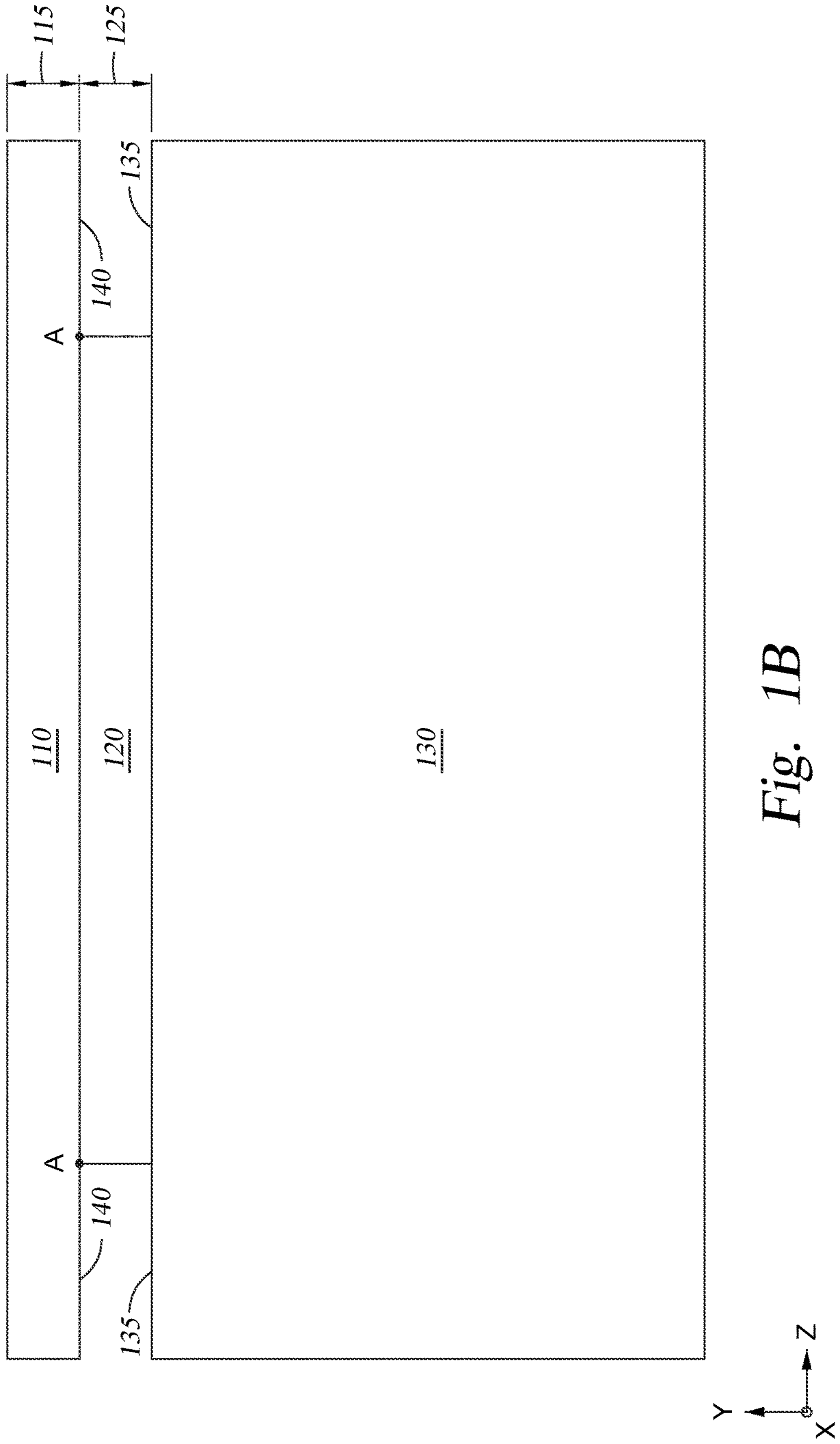

FIGS. 1A and 1B are schematic, cross-sectional views of a flexible substrate 110 according to one or more embodiments. In one embodiment, the flexible substrate is formed from metal, for example copper, aluminum, nickel, or steel. A thickness 115 of the flexible substrate 110 can be between about 1 micrometer to about 100 micrometers. The flexible substrate 110 is processed in a process chamber, e.g., the process chamber 400 of FIG. 4, which contains a plurality of rollers. The rollers may be idle rollers, tension rollers, spreader rollers, etc. In one embodiment, which can be combined with other embodiments described herein, the flexible substrate 110 is disposed on a primary roller 130, and the primary roller 130 is configured to transport the flexible substrate 110.

A coating 120 is provided on the flexible substrate 110. A thickness 125 of the coating 120 can be between about 1 micrometer to about 100 micrometers. The coating 120 can include multiple layers of material. Examples of materials that can be used for the coating 120 include, but are not limited to, carbon, graphite, silicon, silicon oxide, silicon-containing graphite, lithium, lithium metal foil, a lithium alloy foil (e.g. lithium aluminum alloys, lithium silver alloys, etc.), nickel, copper, silver, tin, indium, gallium, tin, bismuth, niobium, molybdenum, tungsten, chromium, titanium, lithium titanate, silicon, oxides thereof, metal oxides, composites thereof, or combinations thereof. In one example, the coating 120 includes a layer of graphite or silicon-containing graphite with a thin layer of lithium disposed thereon. In one embodiment, as shown in FIG. 1A, the coating 120 is disposed on two sides of the flexible substrate 110. In another embodiment, as shown in FIG. 1B, the coating 120 is disposed on a single side of the flexible substrate 110. The coating 120 covers a central portion of the flexible substrate 110, resulting in uncoated edge regions 140.

The primary roller 130 transports the flexible substrate 110 through the process chamber by creating tension in the flexible substrate 110. However, the coating 120 is raised relative to the flexible substrate 110 due to the thickness 125 of the coating 120. Thus, the edge regions 140 of the flexible substrate 110 do not contact the primary roller 130, thereby forming a gap between the flexible substrate 110 and the primary roller 130. When the edge regions 140 of the flexible substrate 110 do not contact edge regions 135 of the primary roller 130, the edge regions 140 of the flexible substrate 110 do not experience the tension experienced by the central portion of the flexible substrate 110 having the coating 120 disposed thereon. Maximum stress due to tension differences along the flexible substrate 110 typically occurs at points A, where the coating 120 ends on the flexible substrate 110. This difference in tension along the flexible substrate 110 may result in wrinkling and/or tearing of the flexible substrate 110.

Figure 2B:
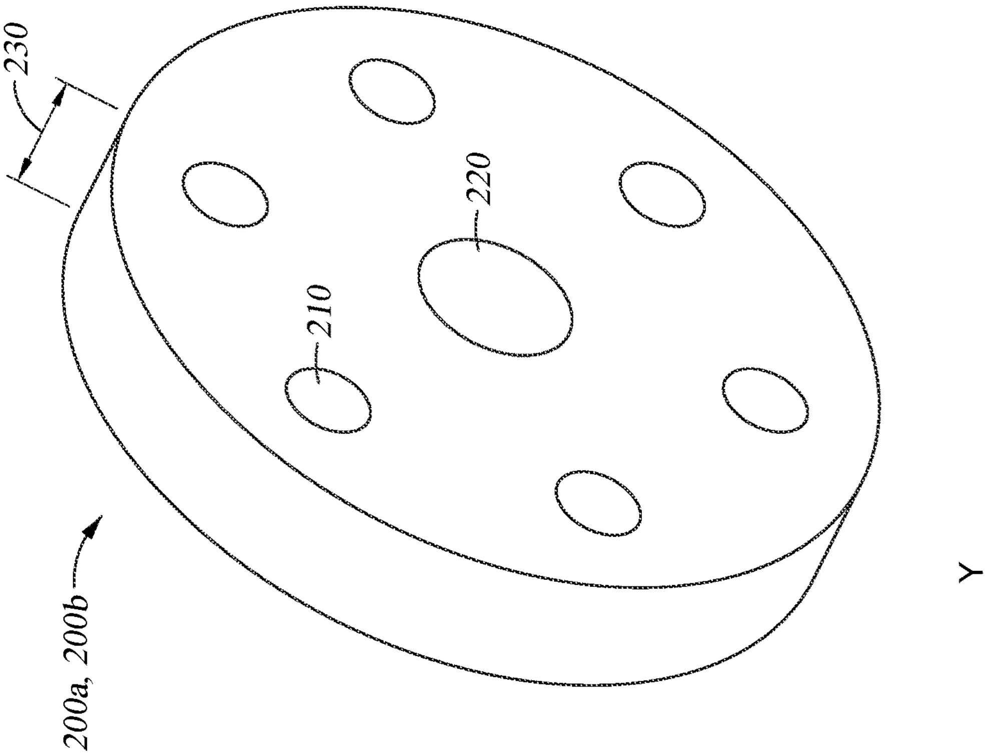
FIG. 2B is a schematic, perspective view of the nip roller of FIG. 2A according to one or more embodiments.
Figure 2A:
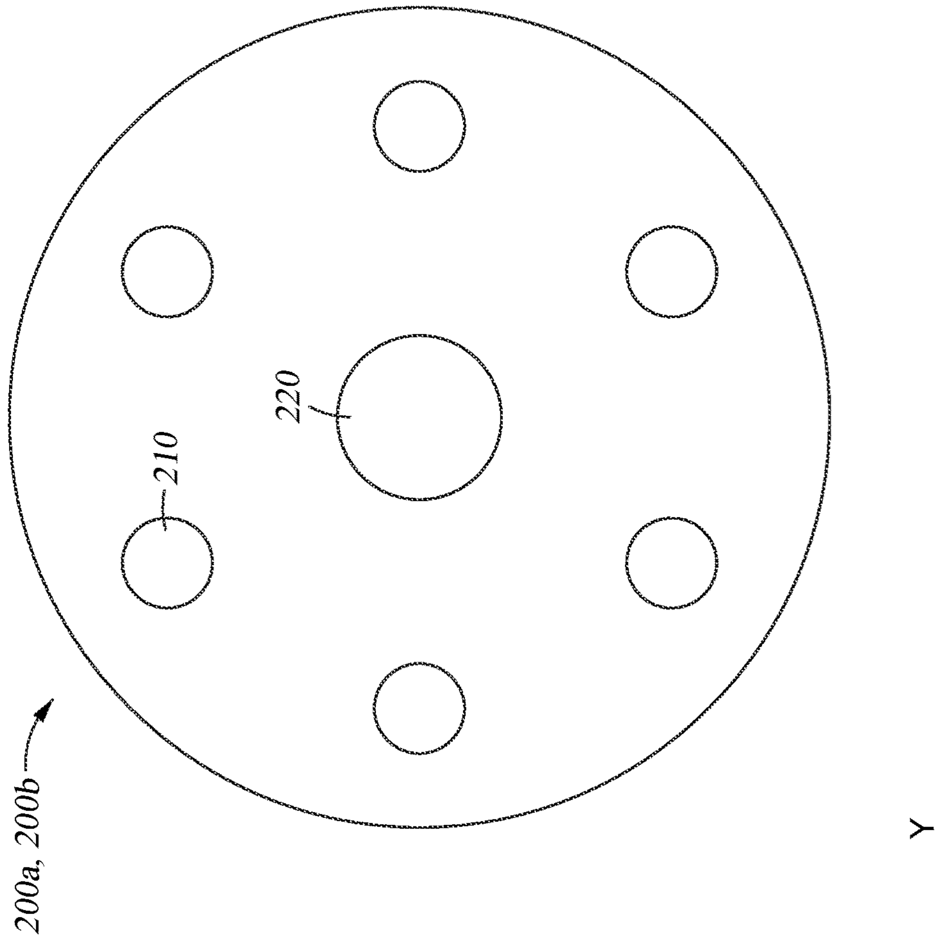
FIG. 2A is a schematic, side-view of a nip roller according to one or more embodiments.

FIG. 2A is a schematic, perspective view of a nip roller 200 according to one or more embodiments. FIG. 2B is a schematic, perspective view of the nip roller 200 of FIG. 2A according to one or more embodiments. The use of the nip roller 200 in this way reduces the risk of wrinkling and/or tearing of the flexible substrate 110. In one embodiment, which can be combined with other embodiments described herein, two nip rollers 200 are used for each primary roller 130, e.g., a first nip roller 200*a* and a second nip roller 200*b* (collectively 200). Each nip roller 200 may be mounted to an interior of a processing chamber, such as the processing chamber shown in FIG. 4, through a mounting hole 220. The mounting hole 220 is coupled to a mounting device, for example a mounting bracket 310, as shown in FIG. 3. A width 230 of the nip roller 200 can vary from about 5 mm to about 500 mm, for example, from about 10 mm to about 500 mm. A weight of the nip roller 200 can vary from about 10 grams to about 1000 grams, for example, from about 50 grams to about 1000 grams. In one embodiment, which can be combined with other embodiments described herein, the nip roller 200 is fabricated from polyoxymethylene, otherwise known as Delrin. In another embodiment, which can be combined with other embodiments described herein, the nip roller 200 is fabricated from plastic, steel, aluminum, or copper.

In one embodiment, which can be combined with other embodiments described herein, each nip roller 200 has a plurality of holes 210 disposed therethrough. In one embodiment, which can be combined with other embodiments described herein, six holes 210 are formed through each nip roller 200. In another embodiment, which can be combined with other embodiments described herein, eight holes 210 are formed through each nip roller 200. The plurality of holes 210 may be configured to mount one or more weights (not shown) to increase the contact force between the nip roller 200 and the flexible substrate 110. The plurality of holes 210 are disposed about the nip roller 200 in a manner that evenly distributes the added weight of the one or more weights. In one embodiment, which can be combined with other embodiments described herein, a weight of the one or more weights is between about 1 gram to about 100 grams.

Figure 3A:
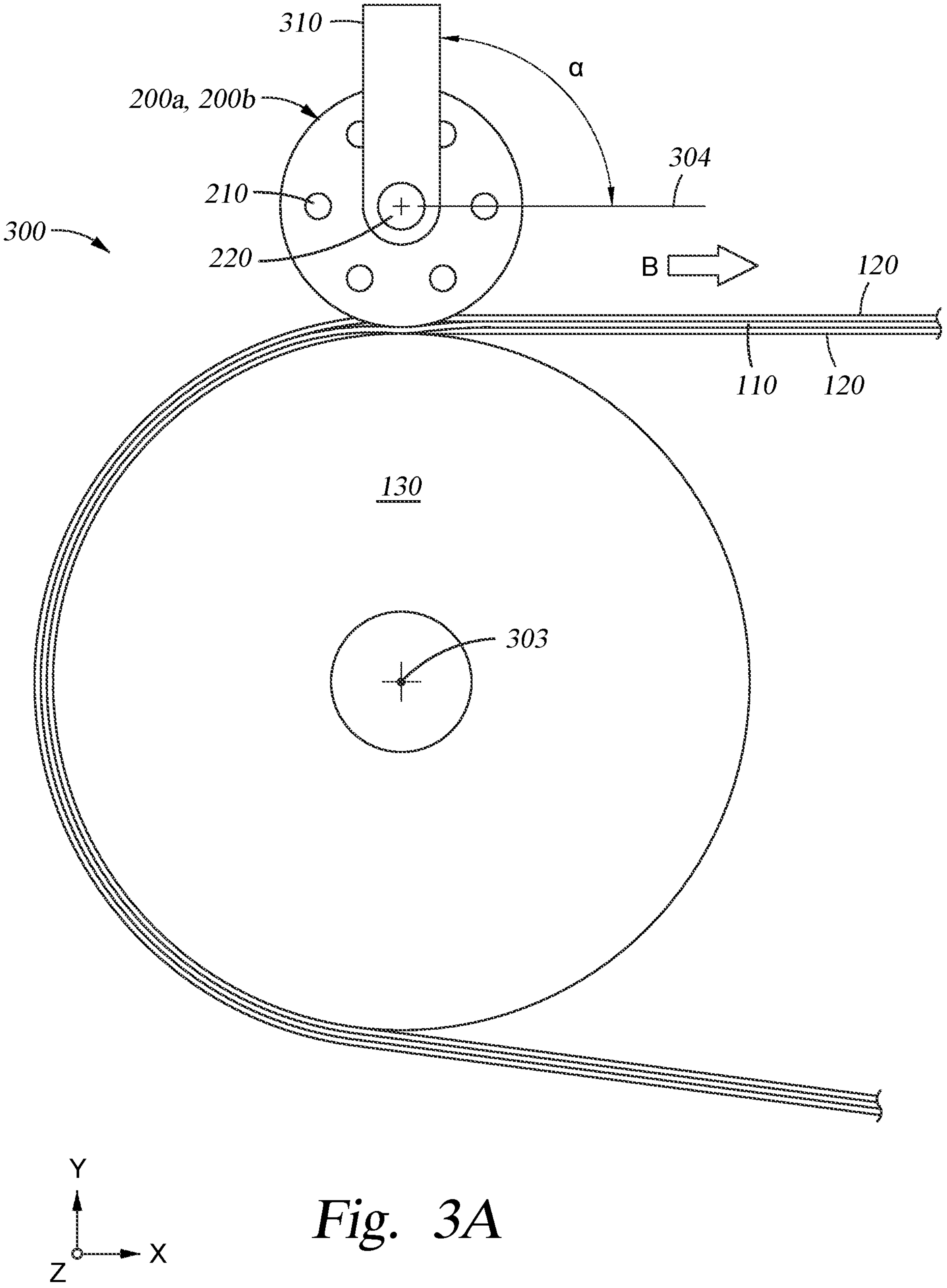
FIG. 3A is a schematic, side-view of a roller assembly according to one or more embodiments.
Figure 3B:
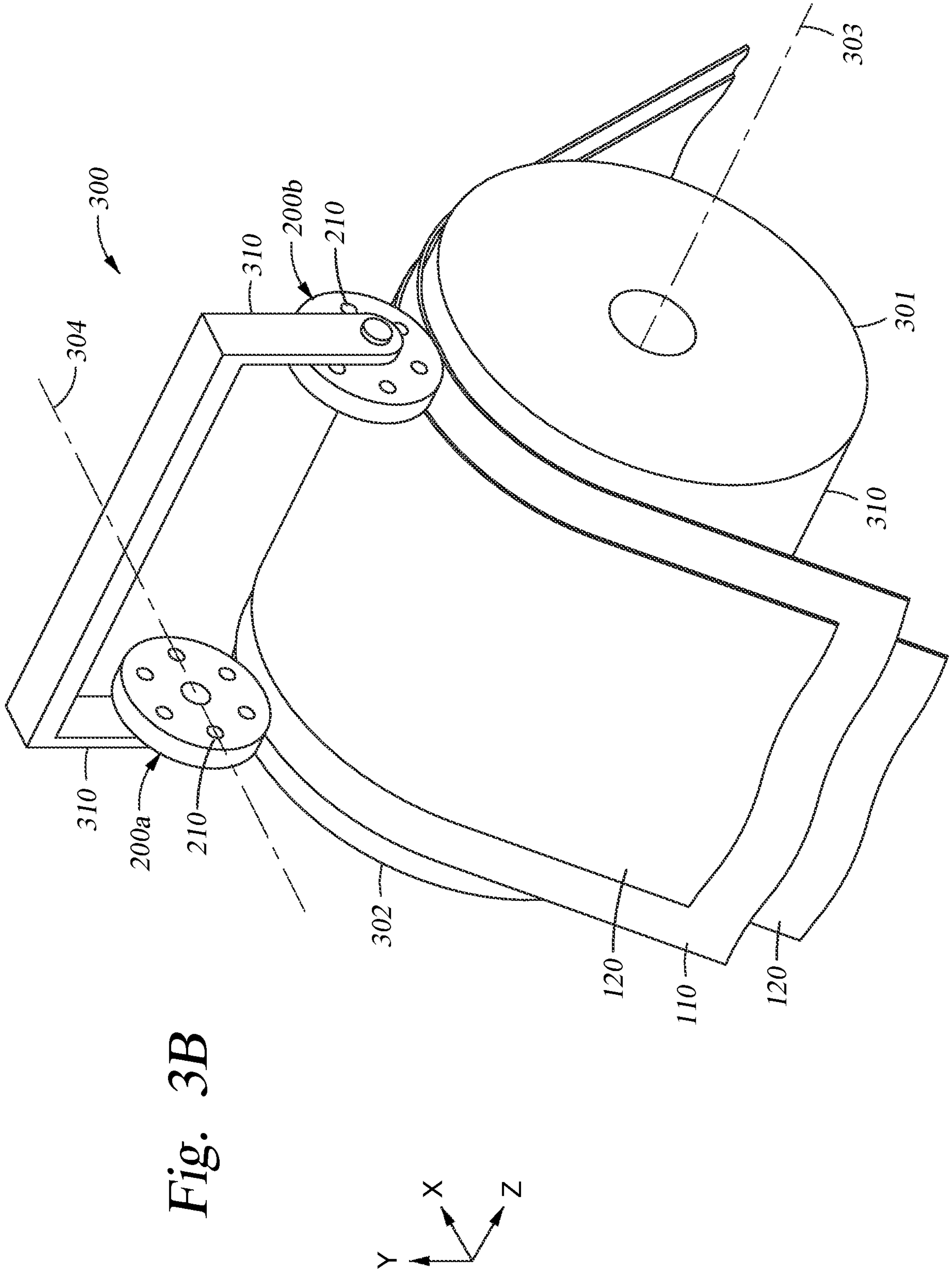
FIG. 3B is a schematic, perspective view of the roller assembly of FIG. 3A according to one or more embodiments.

FIG. 3A is a schematic, side-view of a roller assembly 300 according to one or more embodiments. An arrow B illustrates the path of the flexible substrate 110 in reference to the nip rollers 200 and the primary roller 130. FIG. 3B is a schematic, perspective view of the roller assembly 300 of FIG. 3A. The roller assembly 300 includes one or more nip rollers 200 and the primary roller 130, e.g., the first nip roller 200*a*, a second nip roller 200*b*, and the primary roller 130. A first plurality of holes 210*a* are formed through the first nip roller 200*a*, and a second plurality of holes 210*b* are formed through the second nip roller 200*b*. The flexible substrate 110 is threaded between the nip rollers 200 and the primary roller 130.

The primary roller 130 has a first end 301 and a second end 302. In one embodiment, which can be combined with other embodiments described herein, the first nip roller 200*a* is disposed at the first end 301 of the primary roller 130, and the second nip roller 200*b* is disposed at the second end 302 of the primary roller 130. The nip roller 200 is used to bring the uncoated edge regions 140 of the flexible substrate 110 in contact with the edge regions 135 of the primary roller 130.

The nip rollers 200 are linearly actuatable along a primary axis 303 of the primary roller 130. A mounting angle α of the nip roller 200 is defined as the angle between the mounting bracket 310 and a secondary axis 304 perpendicular to the primary axis 303. The mounting angle α is adjustable and may be modified by adjusting the mounting bracket 310. Additionally, adjusting the mounting angle α varies the force exerted upon the flexible substrate 110 by the nip roller 200.

Figure 4:
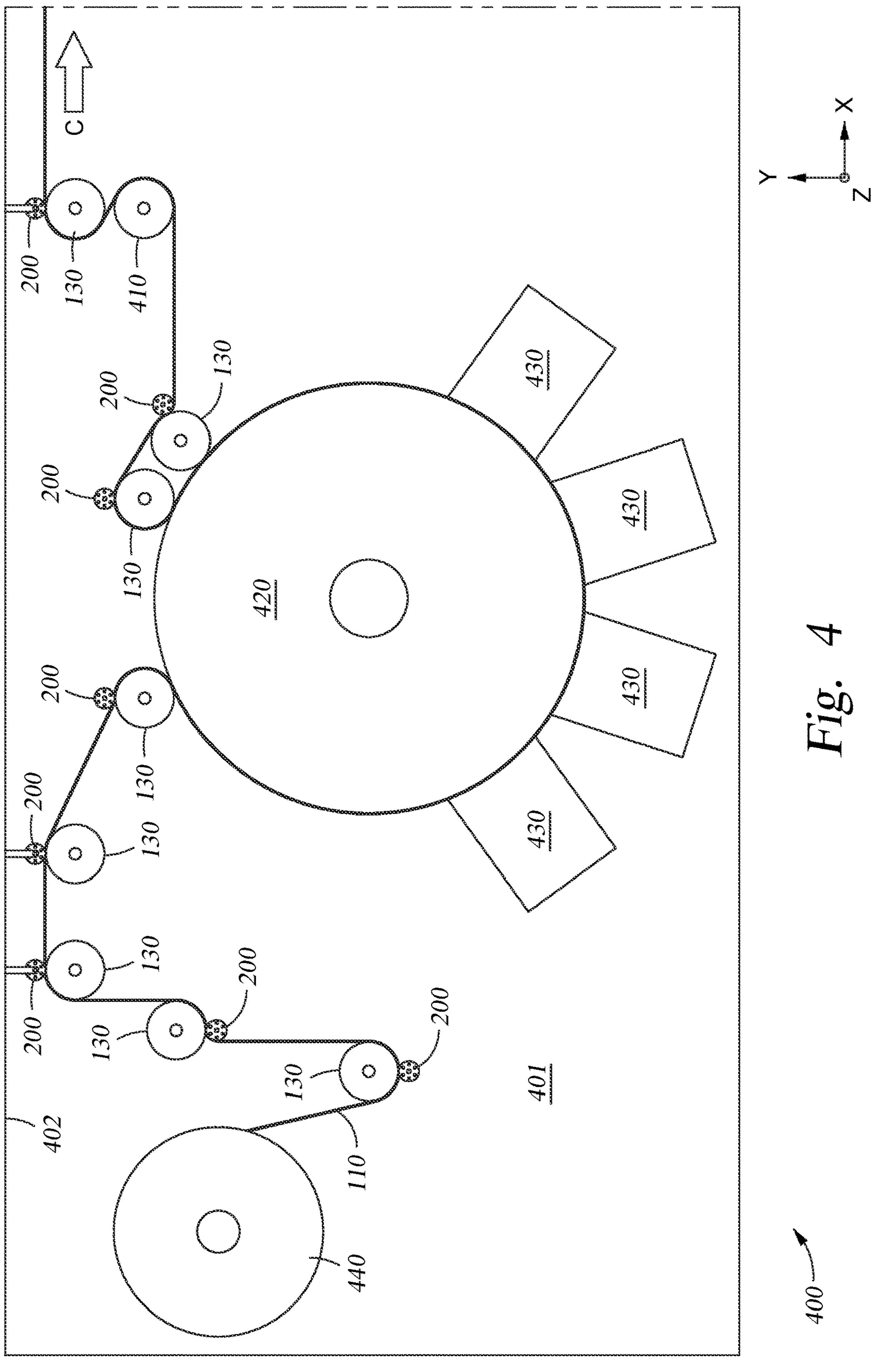
FIG. 4 is a schematic, cross-sectional view of a process chamber according to one or more embodiments.
Figure 5:
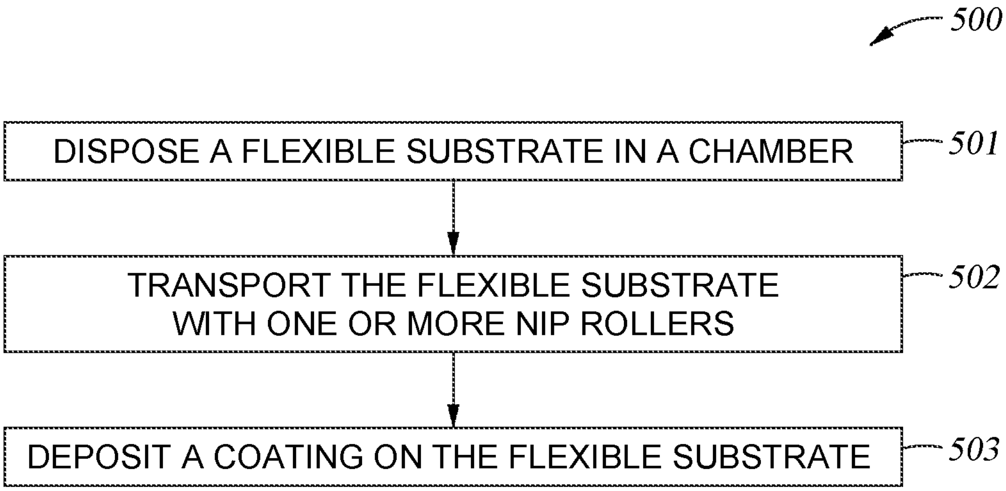
FIG. 5 is a method of fabricating a flexible substrate in the process chamber of FIG. 4 according to one or more embodiments.

FIG. 4 is a schematic, cross-sectional view of an exemplary process chamber 400 according to one or more embodiments. FIG. 5 is a method 500 of fabricating a flexible substrate 110 in the process chamber 400 of FIG. 4 according to one or more embodiments. The process chamber 400 includes a chamber body 402 defining an internal volume 401 therein. In the internal volume 401, the flexible substrate 110 is coated and transported along various roller assemblies, such as the primary roller 130 and nip roller 200. At operation 501, a roll 440 containing the uncoated flexible substrate 110 is disposed in the internal volume 401. The flexible substrate 110 is unwound from the roll 440 as indicated by the substrate movement direction shown by arrow C. In some embodiments, the flexible substrate 110 on the roll 440 is uncoated. In other embodiments, the flexible substrate 110 on the roll 440 already has the one or more coatings 120 deposited thereon.

At operation 502, the flexible substrate 110 is transported by the rollers, e.g., the primary rollers 130 and the nip rollers 200, to deposition areas provided at a coating drum 420. During operation, the coating drum 420 rotates such that the flexible substrate 110 moves in the direction of arrow C. According to one embodiment, which can be combined with other embodiments described herein, the flexible substrate 110 is guided via one or more primary rollers 130 from the roll 440 to the coating drum 420, and from the coating drum 420 to a second roll (not shown) where the flexible substrate 110 is wound after processing thereof. One or more nip rollers 200 are paired with each of the primary rollers 130 in order to minimize wrinkling and tearing of the flexible substrate 110 during the deposition process.

In one embodiment, which can be combined with other embodiments described herein, the coating drum 420 is coupled to one or more deposition sources 430, for example four or more deposition sources 430. The deposition sources 430 participate in the coating process of the flexible substrate 110. The one or more deposition sources 430 can include at least one of an electron beam source, CVD sources, PECVD sources, and various PVD sources. Exemplary PVD sources include sputtering sources, electron beam evaporation sources, and thermal evaporation sources. In one example, the deposition source 430 is a lithium (Li) evaporation source. One or more tension rollers 410 may be disposed to along the path C of the flexible substrate 110 in order to manipulate the tension of the flexible substrate 110. At operation 503, the flexible substrate 110 is coated with one or more thin films, i.e., one or more coatings 120 are deposited on the flexible substrate 110 by the deposition sources 430. The deposition by the deposition sources 430 takes place while the flexible substrate 110 is guided on the coating drum 420.

The process chamber 400 can further include a system controller 490 operable to control various aspects of the process chamber 400. The system controller 490 facilitates the control and automation of the process chamber 400 and can include a central processing unit (CPU), memory, and support circuits (or I/O). Software instructions and data can be coded and stored within the memory for instructing the CPU. The system controller 490 can communicate with one or more of the components of the process chamber 400 via, for example, a system bus. A program (or computer instructions) readable by the system controller 490 determines which tasks are performable on a substrate such as the flexible substrate 110. In some aspects, the program is software readable by the system controller 490, which can include code for monitoring processing conditions, controlling the process chamber 400, and/or controlling application of the nip roller(s) 200. Although a single system controller, the system controller 490 is shown, it should be appreciated that multiple system controllers can be used with the aspects described herein.

In summation, the use of nip rollers in combination with the primary roller minimizes wrinkling and/or tearing of the flexible substrate during processing. Because the roller assembly sandwiches the flexible substrate such that equal amounts of tension are provided along the substrate, overall process uniformity is improved.

Embodiments Listing

The present disclosure provides, among others, the following embodiments, each of which can be considered as optionally including any alternate embodiments:

Clause 1. A roller assembly, comprising: a primary roller for transporting a flexible substrate, wherein the primary roller has a first end and a second end, wherein the flexible substrate has a coating disposed hereon and one or more edge regions are not covered by the coating; a first nip roller disposed at the first end of the primary roller that contacts a first edge region of the one or more edge regions; and a second nip roller disposed at the second end of the primary roller that contacts a second edge region of the one or more edge regions.

Clause 2. The roller assembly of Clause 1, wherein the first nip roller and the second nip roller comprise polyoxymethylene.

Clause 3. The roller assembly of Clause 1 or Clause 2, wherein a mounting angle of the first nip roller is adjustable.

Clause 4. The roller assembly of any one of Clauses 1-3, wherein a mounting angle of the second nip roller is adjustable.

Clause 5. The roller assembly of any one of Clauses 1-4, wherein the first nip roller and the second nip roller are mounted in a process chamber with one or more mounting brackets.

Clause 6. The roller assembly of any one of Clauses 1-5, wherein a first plurality of holes are formed in the first nip roller.

Clause 7. The roller assembly of Clause 6, further comprising one or more weights mounted to the first plurality of holes in order to increase the weight of the first nip roller.

Clause 8. The roller assembly of any one of Clauses 1-7, wherein a second plurality of holes are formed in the second nip roller.

Clause 9. The roller assembly of Clause 8, further comprising one or more weights mounted to the second plurality of holes in order to increase the weight of the second nip roller.

Clause 10. A process chamber, comprising: a chamber body defining an internal volume therein; and one or more roller assemblies positioned in the internal volume and configured to transport a flexible substrate, wherein each of the one or more roller assemblies comprises: a primary roller disposed in the internal volume of the process chamber; a first nip roller having a first plurality of holes formed therethrough; and a second nip roller having a second plurality of holes formed therethrough, wherein each of the first nip roller and the second nip roller contacts a respective edge portion of the flexible substrate.

Clause 11. The process chamber of Clause 10, wherein the first nip roller and the second nip roller comprise polyoxymethylene.

Clause 12. The process chamber of Clause 10 or clause 11, further comprising one or more weights mounted to the first plurality of holes in order to increase the weight of the first nip roller.

Clause 13. The process chamber of any one of Clauses 10-12, further comprising one or more weights mounted to the second plurality of holes in order to increase the weight of the second nip roller.

Clause 14. The process chamber of any one of Clauses 10-13, wherein the first nip roller and the second nip roller are mounted to the chamber body with one or more mounting brackets.

Clause 15. A process chamber for manufacturing a flexible substrate, comprising: a chamber body defining an internal volume therein; a coating drum; and one or more roller assemblies configured to transport a flexible substrate, wherein each of the one or more roller assemblies comprises: a primary roller having a first end and a second end, wherein the primary roller is disposed in the internal volume of the process chamber; a first nip roller disposed at the first end of the primary roller, wherein the first nip roller has a first plurality of holes formed therethrough; and a second nip roller disposed at the second end of the primary roller, wherein the second nip roller has a second plurality of holes formed therethrough.

Clause 16. The process chamber of Clause 15, wherein the first nip roller and the second nip roller are linearly actuatable along a primary axis of the primary roller.

Clause 17. The process chamber of Clause 15 or Clause 16, wherein the first nip roller and the second nip roller comprise polyoxymethylene.

Clause 18. The process chamber of any one of Clauses 15-17, further comprising one or more weights mounted to the first plurality of holes in order to increase the weight of the first nip roller.

Clause 19. The process chamber of any one of Clauses 15-18, further comprising one or more weights mounted to the second plurality of holes in order to increase the weight of the second nip roller.

Clause 20. The process chamber of any one of Clauses 15-19, wherein the first nip roller and the second nip roller are mounted to the chamber body with one or more mounting brackets.

Embodiments and all of the functional operations described in this specification can be implemented in digital electronic circuitry, or in computer software, firmware, or hardware, including the structural means disclosed in this specification and structural equivalents thereof, or in combinations of them. Embodiments described herein can be implemented as one or more non-transitory computer program products, i.e., one or more computer programs tangibly embodied in a machine readable storage device, for execution by, or to control the operation of, data processing apparatus, e.g., a programmable processor, a computer, or multiple processors or computers.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. Processors suitable for the execution of a computer program include, by way of example, both general and special purpose microprocessors, and any one or more processors of any kind of digital computer.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

What is claimed is:

1. A roller assembly, comprising:

a primary roller for transporting a flexible substrate, wherein the primary roller has a first end, a second end, and a primary axis extending from the first end to the second end, wherein the flexible substrate has a coating disposed thereon and one or more edge regions that are not covered by the coating;

a first nip roller disposed at the first end of the primary roller that contacts a first edge region of the one or more edge regions and having a first weight, the first nip roller comprising a mounting hole disposed through a center of the first nip roller and a first plurality of holes encircling the mounting hole, the mounting hole coupled to a first mounting bracket, wherein a mounting angle of the first nip roller is an angle between the first mounting bracket and a secondary axis perpendicular to the primary axis, wherein the first weight is determined by one or more removably affixable first weights mounted to the first plurality of holes; and a second nip roller disposed at the second end of the primary roller that contacts a second edge region of the one or more edge regions and having a second weight independently adjustable to the first weight, the second nip roller comprising a second mounting hole disposed through a center of the second nip roller and a second plurality of holes encircling the second mounting hole, the second mounting hole coupled to a second mounting bracket, wherein a second mounting angle of the second nip roller is an angle between the second mounting bracket and a secondary axis perpendicular to the primary axis, and wherein the second weight is determined by one or more removably affixable second weights mounted to the second plurality of holes.

2. The roller assembly of claim 1, wherein the first nip roller and the second nip roller comprise polyoxymethylene.

3. The roller assembly of claim 1, wherein the mounting angle of the second nip roller is adjustable between a first mounting angle and a second mounting angle.

4. The roller assembly of claim 1, wherein the second nip roller is mounted in a process chamber with a second mounting bracket.

5. The roller assembly of claim 1, wherein the first nip roller and the second nip roller comprise plastic, steel, aluminum, or copper.

6. A process chamber, comprising:

a chamber body defining an internal volume therein;

one or more tension rollers;

one or more deposition sources operatively coupled to a coating drum, the one or more deposition sources comprising at least one of an electron beam source, a chemical vapor deposition (CVD) source, a plasma enhanced (PE) CVD source, and a physical vapor deposition (PVD) source; and one or more roller assemblies positioned in the internal volume and configured to transport a flexible substrate, wherein each of the one or more roller assemblies comprises:

a primary roller disposed in the internal volume of the process chamber, the primary roller having a primary axis;

a first nip roller having a first weight, the first nip roller having a first plurality of holes formed therethrough and a mounting angle, the mounting angle being an angle between a first mounting bracket and a secondary axis perpendicular to the primary axis, and one or more first removably affixable weights mounted to one or more of the first plurality of holes, wherein the one or more first removably affixable weights are used to adjust the first weight of the first nip roller; and a second nip roller having a second weight independently adjustable from the first weight of the first nip roller, the second nip roller having a second plurality of holes formed therethrough, wherein each of the first nip roller and the second nip roller contacts a respective edge portion of the flexible substrate, and one or more second removably affixable weights mounted to one or more of the second plurality of holes, wherein the one or more second removably affixable weights are used to adjust the second weight of the second nip roller.

7. The process chamber of claim 6, wherein the first nip roller and the second nip roller comprise polyoxymethylene.

8. The process chamber of claim 6, further comprising one or more weights mounted to the first plurality of holes in order to increase a weight of the first nip roller.

9. The process chamber of claim 6, further comprising one or more weights mounted to the second plurality of holes in order to increase a weight of the second nip roller.

10. The process chamber of claim 6, wherein the second nip roller is mounted to the chamber body with a second mounting bracket.

11. A process chamber for manufacturing a flexible substrate, comprising:

a chamber body defining an internal volume therein;

a coating drum;

one or more deposition sources operatively coupled to the coating drum, the one or more deposition sources comprising at least one of an electron beam source, a chemical vapor deposition (CVD) source, a plasma enhanced (PE) CVD source, and a physical vapor deposition (PVD) source; and one or more roller assemblies configured to transport a flexible substrate, wherein each of the one or more roller assemblies comprises:

a primary roller having a first end, a second end, and a primary axis extending from the first end to the second end, wherein the primary roller is disposed in the internal volume of the process chamber;

a first nip roller having a first weight, the first nip roller disposed at the first end of the primary roller, wherein the first nip roller has;

a mounting hole disposed through a center of the first nip roller, the mounting hole coupled to a mounting bracket, and a first plurality of holes encircling the mounting hole;

one or more weights mounted to one or more holes of the first plurality of holes in order to increase a weight of the first nip roller, the first plurality of holes distributed around the first nip roller to evenly distribute the added weight; and a mounting angle, the mounting angle being an angle between the mounting bracket and a secondary axis perpendicular to the primary axis; and a second nip roller having a second weight independently adjustable to the first weight, the second nip roller disposed at the second end of the primary roller, wherein the second nip roller has:

a second mounting hole disposed through a center of the second nip roller, the second mounting hole coupled to a second mounting bracket, and a second plurality of holes encircling the mounting hole;

one or more removably affixable second weights mounted to one or more second holes of the second plurality of holes in order to increase the weight of the second nip roller, the second plurality of holes distributed around the second nip roller to evenly distribute the added weight of the one or more removably affixable second weights; and a second mounting angle, the second mounting angle being an angle between the second mounting bracket and a secondary axis perpendicular to the primary axis.

12. The process chamber of claim 11, wherein the first nip roller and the second nip roller are linearly actuatable along the primary axis of the primary roller.

13. The process chamber of claim 11, wherein the first nip roller and the second nip roller comprise polyoxymethylene.

14. The process chamber of claim 11, wherein the second nip roller is mounted to the chamber body with a second mounting bracket.

15. The process chamber of claim 11, wherein the one or more weights has a weight of about 1 gram to about 100 grams.

* * * * *